(12) United States Patent
Hautala et al.

(10) Patent No.: US 12,191,156 B2
(45) Date of Patent: Jan. 7, 2025

(54) RIBBON BEAM PLASMA ENHANCED CHEMICAL VAPOR DEPOSITION SYSTEM FOR ANISOTROPIC DEPOSITION OF THIN FILMS

(71) Applicant: APPLIED Materials, Inc., Santa Clara, CA (US)

(72) Inventors: John Hautala, Beverly, MA (US); Tristan Y. Ma, Lexington, MA (US); Peter F. Kurunczi, Cambridge, MA (US)

(73) Assignee: Applied Materials, Inc., Santa Clara, CA (US)

( * ) Notice: Subject to any disclaimer, the term of this patent is extended or adjusted under 35 U.S.C. 154(b) by 174 days.

(21) Appl. No.: 16/840,424

(22) Filed: Apr. 5, 2020

(65) Prior Publication Data

US 2021/0189566 A1 Jun. 24, 2021

Related U.S. Application Data

(60) Provisional application No. 62/949,582, filed on Dec. 18, 2019.

(51) Int. Cl.
*C23C 16/50* (2006.01)
*C23C 14/22* (2006.01)
(Continued)

(52) U.S. Cl.
CPC ...... *H01L 21/31116* (2013.01); *C23C 14/225* (2013.01); *C23C 16/45563* (2013.01);
(Continued)

(58) Field of Classification Search
None
See application file for complete search history.

(56) References Cited

U.S. PATENT DOCUMENTS 7,872,406 B2 1/2011 Matacotta
10,840,132 B1 11/2020 Gilchrist et al.
(Continued)

FOREIGN PATENT DOCUMENTS

CN 103199058 A 7/2013
JP H109289193 A 11/1997
(Continued)

OTHER PUBLICATIONS

International Search Report dated Feb. 22, 2021, for the International Patent Application No. PCT/ US2020/057253, filed on Oct. 25, 2020, 4 pages.
(Continued)

*Primary Examiner* — Elizabeth A Burkhart
(74) *Attorney, Agent, or Firm* — KDW FIRM PLLC

(57) ABSTRACT

A ribbon beam plasma enhanced chemical vapor deposition (PECVD) system comprising a process chamber containing a platen for supporting a substrate, and a plasma source disposed adjacent the process chamber and adapted to produce free radicals in a plasma chamber, the plasma chamber having an aperture associated therewith for allowing a beam of the free radicals to exit the plasma chamber, wherein the process chamber is maintained at a first pressure and the plasma chamber is maintained at a second pressure greater than the first pressure for driving the free radicals from the plasma chamber into the process chamber.

17 Claims, 6 Drawing Sheets

(51) Int. Cl.

| | |
|---|---|
| *C23C 16/455* | (2006.01) |
| *C23C 16/458* | (2006.01) |
| *H01J 37/305* | (2006.01) |
| *H01J 37/32* | (2006.01) |
| *H01L 21/308* | (2006.01) |
| *H01L 21/311* | (2006.01) |
| *C23C 14/34* | (2006.01) |
| *C23C 14/46* | (2006.01) |

(52) U.S. Cl.
CPC .......... *C23C 16/4583* (2013.01); *C23C 16/50* (2013.01); *H01J 37/3053* (2013.01); *H01J 37/32458* (2013.01); *H01J 37/32623* (2013.01); *H01J 37/32816* (2013.01); *H01L 21/3086* (2013.01); *H01L 21/31144* (2013.01); *C23C 14/3442* (2013.01); *C23C 14/46* (2013.01); *H01J 2237/3151* (2013.01); *H01J 2237/3321* (2013.01)

(56) References Cited

U.S. PATENT DOCUMENTS

| | | |
|---|---|---|
| 10,879,055 B2 | 12/2020 | Hatem et al. |
| 11,043,394 B1 | 6/2021 | Hautala |
| 2005/0034666 A1 | 2/2005 | Chistyakov |
| 2008/0164819 A1 | 7/2008 | Hwang et al. |
| 2009/0098306 A1 | 4/2009 | Druz et al. |
| 2014/0038393 A1 | 2/2014 | Godet |
| 2014/0170795 A1* | 6/2014 | Prabhakar ........... H01L 31/1804 438/57 |
| 2014/0202633 A1 | 7/2014 | Godet et al. |
| 2015/0011093 A1* | 1/2015 | Singh ................ H01J 37/32623 438/712 |
| 2015/0069017 A1* | 3/2015 | Buonodono ...... H01J 37/32541 118/712 |
| 2016/0379816 A1 | 12/2016 | Ruffell et al. |
| 2017/0069488 A1 | 3/2017 | Yieh et al. |
| 2019/0256966 A1* | 8/2019 | Anglin ............. H01L 21/02115 |
| 2019/0355581 A1 | 11/2019 | Anglin et al. |
| 2020/0194271 A1 | 6/2020 | Anglin et al. |
| 2021/0020499 A1 | 1/2021 | Gilchrist et al. |

FOREIGN PATENT DOCUMENTS

| | | |
|---|---|---|
| JP | 2001226775 A | 8/2001 |
| JP | 2016540360 A | 12/2016 |
| KR | 10-2007-0119072 A | 12/2001 |
| WO | 2015035116 A1 | 3/2015 |

OTHER PUBLICATIONS

Written Opinion dated Feb. 22, 2021, for the International Patent Application No. PCT/US2020/057253, filed on Oct. 25, 2020, 5 pages.

* cited by examiner

RIBBON BEAM PLASMA ENHANCED CHEMICAL VAPOR DEPOSITION SYSTEM FOR ANISOTROPIC DEPOSITION OF THIN FILMS

CROSS-REFERENCES TO RELATED APPLICATIONS

This application claims the benefit of U.S. Provisional Patent Application No. 62/949,582, filed Dec. 18, 2019, which is incorporated by reference herein in its entirety.

FIELD OF THE DISCLOSURE

Embodiments of the present disclosure relate generally to the field of semiconductor device fabrication, and more particularly to a plasma enhanced chemical vapor deposition system capable of depositing thin films at oblique angles in a directionally specific manner relative to the surface of a target substrate.

BACKGROUND OF THE DISCLOSURE

Plasma enhanced chemical vapor deposition (PECVD) is a relatively low temperature chemical vapor deposition process used to deposit thin films on substrates (e.g., silicon wafers). A conventional PECVD process involves igniting a plasma by applying a high frequency voltage to a low-pressure feed gas (e.g., silane, methane, etc.) in a process chamber. The plasma contains ionized gas species, electrons, and neutral species in ground and excited states. Within the plasma, inelastic collisions take place between electrons and gas molecules to form reactive species, such as excited neutrals and free radicals, as well as ions and electrons. The reactive species chemically react with the surface of a target substrate disposed within the process chamber to form a thin film thereon.

In conventional PECVD processes, the free radicals of a plasma are typically distributed over the exposed surfaces of a target substrate in a directionally non-specific, isotropic manner, resulting in the formation of a thin film of uniform thickness on the substrate. This type of uniform deposition is desirable for some applications. In other applications, directionally specific, anisotropic deposition is desirable. For example, directing a reactive species toward a substrate at a specific, oblique angle relative to a surface of the substrate may be desirable for depositing films on specific sides and/or portions of surface features (e.g., trenches, fins, etc.) of a substrate while keeping other sides and/or portions of such surface features free of such depositions. Directionally depositing thin films on substrates in this manner has heretofore not been possible using conventional PECVD systems.

With respect to these and other considerations, the present improvements may be useful.

SUMMARY

This Summary is provided to introduce a selection of concepts in a simplified form further described below in the Detailed Description. This Summary is not intended to identify key features or essential features of the claimed subject matter, nor is the summary intended as an aid in determining the scope of the claimed subject matter.

An exemplary embodiment of a ribbon beam plasma enhanced chemical vapor deposition (PECVD) system in accordance with the present disclosure may include a process chamber containing a platen for supporting a substrate, and a plasma source disposed adjacent the process chamber and adapted to produce free radicals in a plasma chamber, the plasma chamber having an aperture associated therewith for allowing a beam of the free radicals to exit the plasma chamber, wherein the process chamber is maintained at a first pressure and the plasma chamber is maintained at a second pressure greater than the first pressure for driving the free radicals from the plasma chamber into the process chamber.

Another exemplary embodiment of a ribbon beam PECVD system in accordance with the present disclosure may include a process chamber containing a platen for supporting a substrate, and a plasma source disposed adjacent the process chamber and adapted to produce free radicals from a gaseous species supplied to a plasma chamber, the plasma chamber having an aperture associated therewith for allowing a beam of the free radicals to exit the plasma chamber, wherein the process chamber is maintained at a first pressure in a range of $10^{-6}$ torr to $10^{-2}$ torr, and the plasma chamber is maintained as a second pressure in a range of 1 millitorr to 1 torr, and wherein at least one of the platen and the plasma chamber is at least one of movable and rotatable for directing the beam toward the platen at an oblique angle relative to a surface of the platen.

An exemplary method of operating a ribbon beam PECVD system including a process chamber containing a platen for supporting a substrate, and a plasma source disposed adjacent the process chamber, the method including supplying a gaseous species to a plasma chamber of the plasma source from a gas source, igniting the gaseous species to produce an energetic plasma in the plasma chamber, and establishing a pressure differential between the plasma chamber and the process chamber to extract a collimated ribbon beam containing free radicals of the plasma through an aperture associated with the plasma chamber, wherein the collimated ribbon beam is directed toward the substrate

BRIEF DESCRIPTION OF THE DRAWINGS

By way of example, various embodiments of the disclosed techniques will now be described, with reference to the accompanying drawings, wherein.

DETAILED DESCRIPTION

Figure 1:
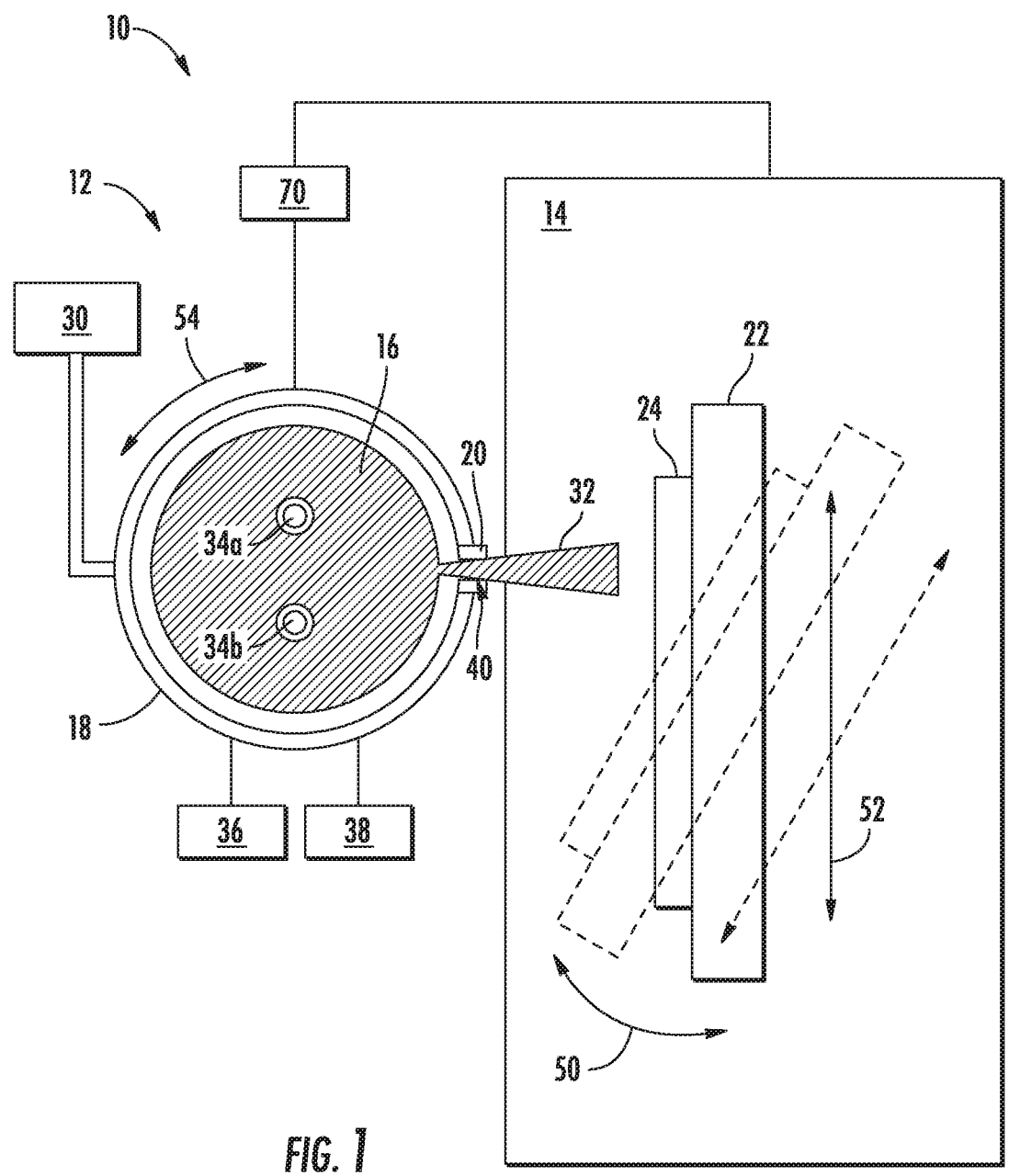
FIG. 1 is a schematic cross-sectional view illustrating a ribbon beam plasma enhanced chemical vapor deposition (PECVD) system in accordance with an exemplary embodiment of the present disclosure.

The present embodiments will now be described more fully hereinafter with reference to the accompanying drawings, wherein some embodiments are shown. The subject matter of the present disclosure may be embodied in many different forms and is not to be construed as limited to the embodiments set forth herein. These embodiments are provided so this disclosure will be thorough and complete, and will convey certain exemplary aspects of the subject matter to those skilled in the art. In the drawings, like numbers refer to like elements throughout.

Referring to FIG. 1A, a schematic cross-sectional view illustrating a ribbon beam plasma enhanced chemical vapor deposition system 10 (hereinafter "the system 10") in accordance with an exemplary embodiment of the present disclosure is shown. The system 10 may generally include a plasma source 12 disposed adjacent a process chamber 14. The plasma source 12 may be adapted to generate an energetic plasma 16 in a plasma chamber 18, and to emit the plasma 16 (e.g., through a nozzle 20 of the plasma chamber 18) as further described below. While the plasma chamber 18 is depicted as being generally cylindrical in shape, the present disclosure is not limited in this regard, and the plasma chamber 18 may be implemented in a variety of alterative shapes and configurations.

The process chamber 14 may contain a platen 22 adapted to support a substrate 24 (e.g., a silicon wafer) in a confronting relationship with the nozzle 20 of the plasma chamber 18. In various embodiments, the platen 22 may be adapted to forcibly retain the substrate 24, such as via electrostatic clamping or mechanical clamping. Additionally, the platen 22 may include a heating element (not shown) for controllably heating the substrate 24 to a desired temperature (e.g., a temperature in a range between room temperature and 450 degrees Celsius) to enhance deposition processes.

The plasma source 12 of the system 10 may be configured to generate the plasma 16 from a gaseous species supplied to the plasma chamber 18 by one or more gas sources 30. The gaseous species may include one or more of SiH4, CH4, NH3, O2, N2, SiCl4, GeH4, Ar, WF6, etc. The present disclosure is not limited in this regard. The plasma 16 (and particularly free radicals within the plasma) may be projected through the nozzle 20 in the form of a ribbon beam 32 directed at the substrate 24 as further described below. In various embodiments, the plasma source 12 may be a radio frequency (RF) plasma source (e.g., an inductively-coupled plasma (ICP) source, a capacitively coupled plasma (CCP) source, a helicon source, an electron cyclotron resonance (ECR) source, etc.). For example, the plasma source 12 may include electrodes 34a, 34b, an RF generator 36, and an RF matching network 38 for igniting and sustaining the plasma 16 in a manner familiar to those of ordinary skill in the art. The present disclosure is not limited in this regard.

The plasma 16 generated in the plasma chamber 18 may contain ionized gas species (ions), electrons, excited neutrals, and free radicals. In conventional plasma enhanced chemical vapor deposition (PECVD) systems, a substrate is located in the same chamber as a plasma, and free radicals within the plasma are distributed over the surface of the substrate in a directionally-nonspecific, isotropic manner to form a thin film of generally uniform thickness on the exposed surface(s) of the substrate. By contrast, the plasma chamber 18 of the system 10 is separate from the process chamber 14 where the platen 22 and the substrate 24 reside, and a collimated ribbon beam 32 containing free radicals of the plasma 16 is extracted from the plasma chamber 18 and is directed at the substrate 24 in a directionally-specific, anisotropic manner. This is achieved by establishing a pressure differential between the plasma chamber 18 and the process chamber 14, and by collimating the extracting the ion beam. In a non-limiting example, the ion beam may be extracted through a nozzle 20 having an elongated profile (described in greater detail below). With regard to the pressure differential, the process chamber 14 may be maintained at a first pressure, and the plasma chamber 18 may be maintained at a second pressure higher than the first pressure. In various examples, the first pressure in the process chamber may be in a range of $10^{-6}$ torr to $10^{-2}$ torr, and the second pressure in the plasma chamber 18 may be in a range of 1 millitorr to 1 torr. The present disclosure is not limited in this regard. Thus, the pressure differential between the plasma chamber 18 and the process chamber 14 may provide a motive force for driving free radicals in the plasma 16 from the plasma chamber 18 into the process chamber 14 in the form of a ribbon beam 32.

Figure 2A:
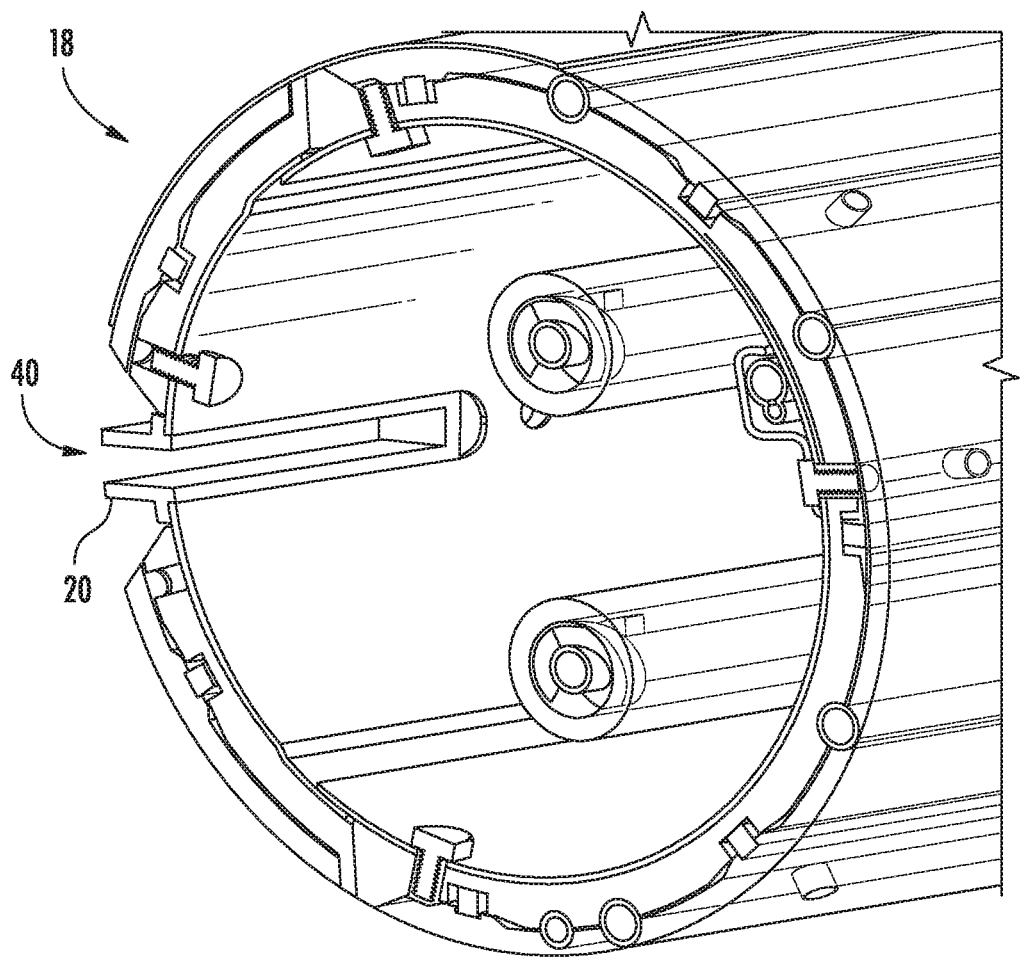
FIGS. 2A and 2B are perspective, cross-sectional detail views illustrating an embodiment of a nozzle of the ribbon beam PECVD system shown in FIG. 1.
Figure 2B:
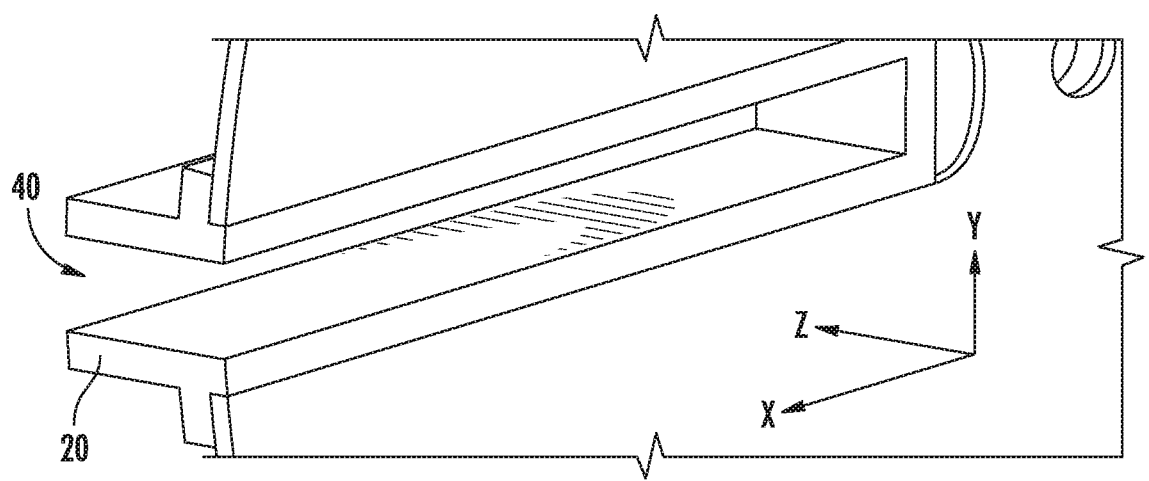

The ribbon beam 32 may be given its shape and may be collimated using various structures, devices, and techniques. In one example, the ribbon beam 32 may be given its shape and may be collimated by the elongated, low-profile nozzle 20 of the plasma chamber 18. The nozzle 20 is illustrated in greater detail in the isometric cross-sectional views shown in FIGS. 2A and 2B. As depicted, the nozzle 20 may define an aperture 40 having a width measured in a direction parallel to the X-axis (and parallel to a longitudinal axis of the plasma chamber 18) of the illustrated Cartesian coordinate system, and having a height measured in a direction parallel to the Y-axis of the illustrated Cartesian coordinate system. In various embodiments, an aspect ratio of the width of the aperture 40 relative to the height of the aperture 40 may be in a range of 12:1 to 60:1. In specific examples, the aperture 40 may have a width of 300 millimeters and a height in a range of 5 millimeters to 25 millimeters. The present disclosure is not limited in this regard.

The nozzle 20 may extend radially from the plasma chamber 18, thus providing the aperture 40 with a depth as measured in a direction parallel to the Z-axis of the illustrated Cartesian coordinate system. In various embodiments, the aperture 40 may have a depth in a range of 7 millimeters to 20 millimeters. In a particular embodiment, the aperture 40 may have a depth of 10 millimeters. The present disclosure is not limited in this regard. Thus, the radially-elongated nozzle 20 may funnel or channel free radicals exiting the plasma chamber 18 in the ribbon beam 32, and may tend to collimate the free radicals and facilitate a long mean free path of the free radicals, where the free radicals (and the ribbon beam 32 generally) may otherwise tend to diverge after exiting the plasma chamber 18. An intended directionality of the ribbon beam 32 may thus be preserved when used to selectively deposit a thin film on the substrate 24. In various embodiments, the nozzle 20 may be omitted, and the plasma chamber 18 may have an extraction aperture formed in a sidewall thereof. The present disclosure is not limited in this regard.

Figure 3A:
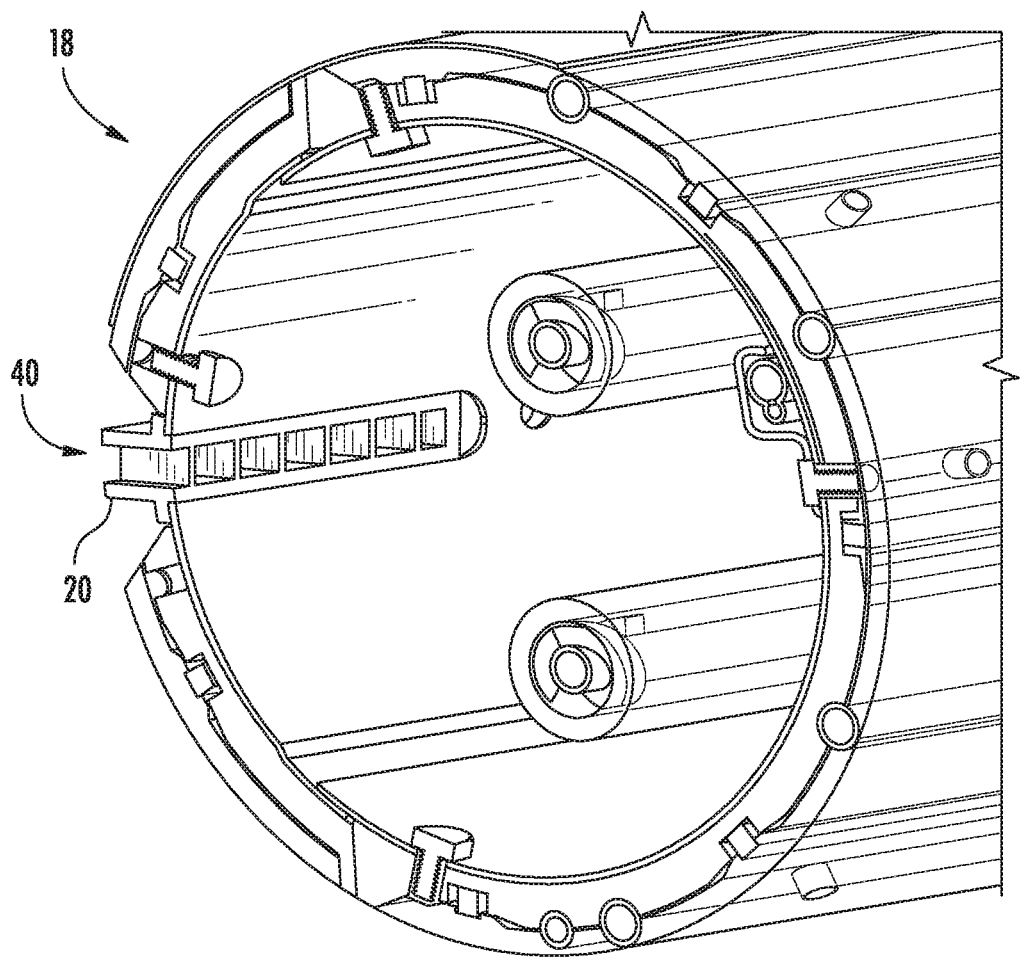
FIGS. 3A and 3B are perspective, cross-sectional detail views illustrating another embodiment of a nozzle of the ribbon beam PECVD system shown in FIG. 1.
Figure 3B:
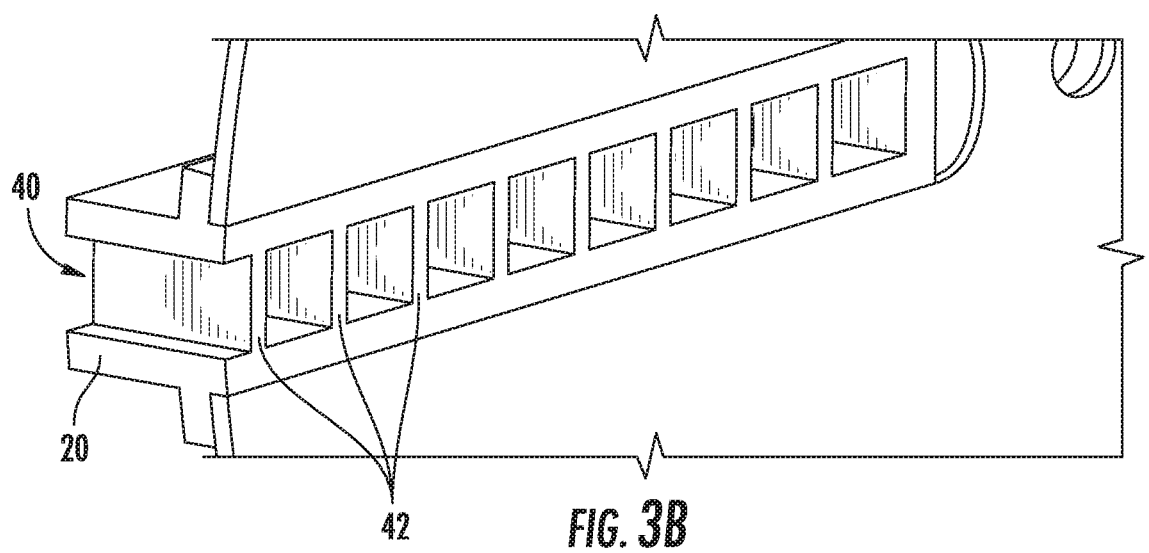
Figure 4:
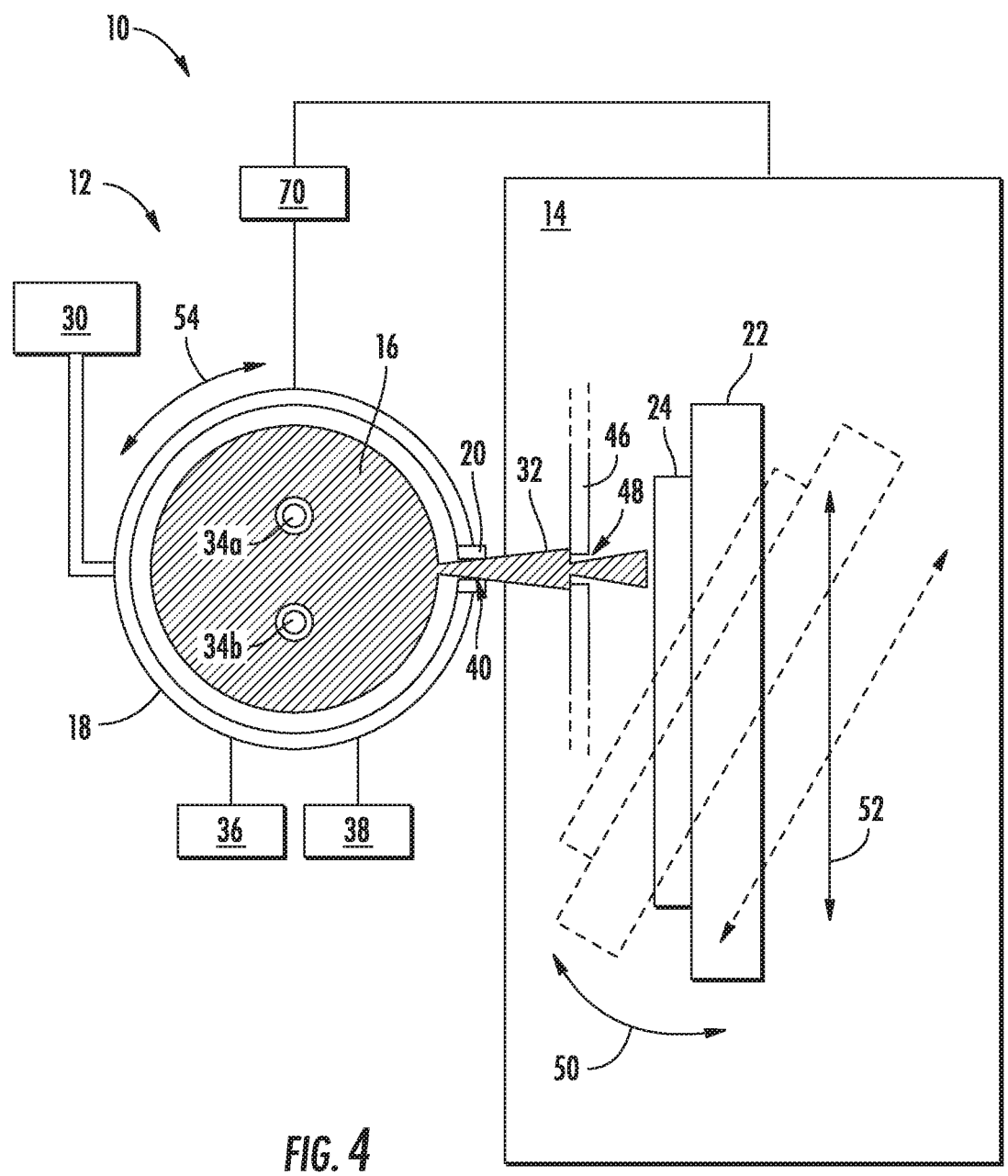
FIG. 4 is a schematic cross-sectional view illustrating an alternative embodiment of the ribbon beam PECVD system shown in FIG. 1 including a secondary aperture for improved ribbon beam collimation.

Referring to FIGS. 3A and 3B, an alternative embodiment of the nozzle 20 is shown, wherein the nozzle 20 includes a plurality of vertically oriented cross members 42 disposed in a parallel, spaced apart relationship across the width of the aperture 40. The cross members 42 may facilitate further funneling and channeling of the free radicals exiting the plasma chamber 18 relative to the embodiment of the nozzle 20 shown in FIGS. 2A and 2B. Referring to FIG. 4, an alternative embodiment of the system 10 is shown wherein a barrier 46 defining a secondary aperture 48 is disposed between the plasma chamber 18 and the substrate 24, with the secondary aperture 48 located in the path of the ribbon beam 32. The secondary aperture 48 may operate to further collimate, or "re-collimate," the ribbon beam 32 at a location nearer the substrate 24 than the aperture 40 (also referred to hereinafter as "the primary aperture 40"), thus improving collimation of the ribbon beam 32 relative to the embodiment of the system 10 show in FIG. 1.

Referring back to FIG. 1, the platen 22 may be rotatable and movable for pivoting and scanning the substrate 24 relative to the plasma chamber 18 as indicated by arrows 50 and 52. Additionally or alternatively, the plasma chamber 18 may be rotatable about its long axis as indicated by the arrow 54. Thus, the collimated, free radical-containing ribbon beam 32 may be projected onto the substrate 24 at various oblique angles in a highly directional, anisotropic manner to deposit films on specific sides and/or portions of surface features (e.g., trenches, fins, etc.) of the substrate 24 while keeping other sides and/or portions of such surface features free of such depositions. In a non-limiting example, the movement and/or rotation of the platen 22 and/or the plasma chamber 18 may facilitate projecting the ribbon beam 32 onto the substrate 24 at angles in a range of 30 degrees to 80 degrees relative to a surface of the platen 22 with angle spreads in a range of +/−5 degrees to +/−30 degrees.

Figure 5:
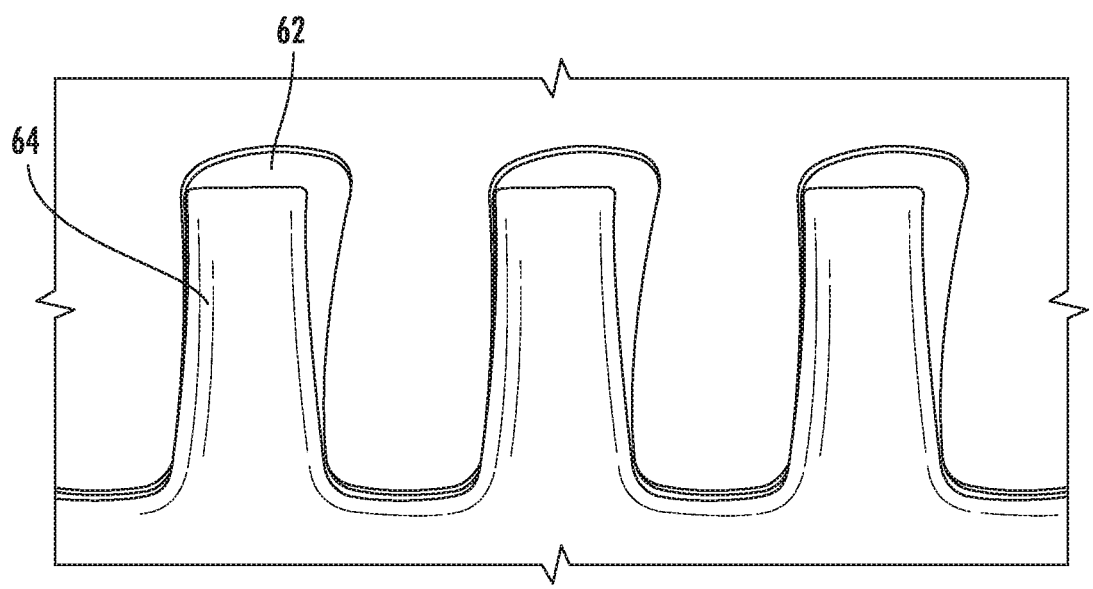
FIG. 5 is a side view illustrating directional deposition of a thin film on a set of patterned features as produced by the ribbon beam PECVD system shown in FIG. 1.

For example, FIG. 5 depicts a directional deposition of a thin film 62 on a set of patterned features 64 (e.g., fins, castellations, etc.), where the film 62 is deposited just on right sidewalls and upper surfaces of the patterned features 64 by directing the ribbon beam 32 toward the patterned features 64 from the upper right of the figure. The left sidewalls and floors between the patterned features 64, being shielded/shadowed by the right sidewalls and upper surfaces of the patterned features 64, are kept free of deposition.

In various embodiments, the system 10 may further include a bias supply 70 coupled to the plasma chamber 18 and the process chamber 14. The bias supply 70 may selectively apply a voltage difference between the plasma chamber 18 and the substrate 24 for extracting ions from the plasma chamber 18 via the nozzle 20, making the ribbon beam 32 rich in free radicals and in ions. The ions in the ribbon beam 32 may increase the affinity of the substrate surface with respect to the free radicals in the ribbon beam 32, thus enhancing thin film deposition. In various embodiments, the system 10 may be operated in an "ion beam mode," wherein the bias supply 70 is activated/implemented to extract ions from the plasma chamber 18 and to provide an ion rich ribbon beam 32, and a "radical mode," wherein the bias supply 70 is deactivated or otherwise not used to extract ions from the plasma chamber 18 to produce a ribbon beam rich in free radicals and not rich in ions.

Figure 6:
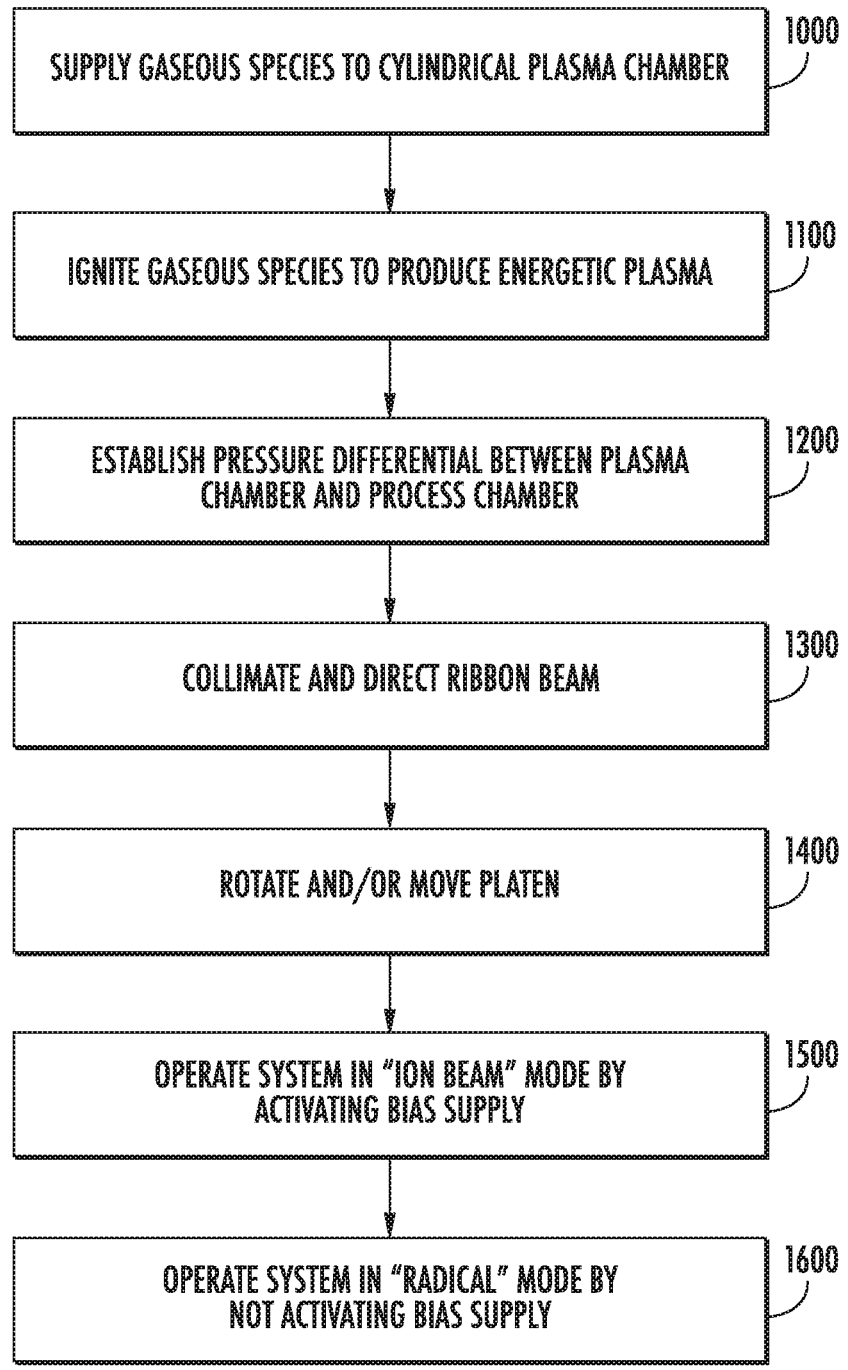
FIG. 6 is a flow diagram illustrating a method of operating a PECVD system in accordance with an exemplary embodiment of the present disclosure.

Referring to FIG. 6, a flow diagram illustrating an exemplary method for operating the above-described system 10 in accordance with the present disclosure is shown. The method will now be described in conjunction with the illustrations of the system 10 shown in FIGS. 1-4.

At block 1000 of the exemplary method, a gaseous species may be supplied to the plasma chamber 18 from the gas source 30. The gaseous species may include one or more of SiH4, CH4, NH3, O2, N2, SiCl4, GeH4, Ar, WF6, etc. The present disclosure is not limited in this regard. At block 1100 of the method, the gaseous species in the plasma chamber 18 may be ignited to produce an energetic plasma 16

At block 1200 of the exemplary method, a pressure differential may be established between the plasma chamber 18 and the process chamber 14 to extract a collimated ribbon beam 32 containing free radicals from the plasma chamber 18, wherein the collimated ribbon beam 32 is directed toward a substrate 24 disposed on the platen 22 within the process chamber 14. For example, the process chamber 14 may be maintained a first pressure, and the plasma chamber 18 may be maintained at a second pressure higher than the first pressure. In various examples, the first pressure in the process chamber may be in a range of $10^{-6}$ torr to $10^{-2}$ torr, and the second pressure in the plasma chamber 18 may be in a range of 1 millitorr to 1 torr. The present disclosure is not limited in this regard.

At block 1300 of the exemplary method, the ribbon beam 32 containing free radicals may be collimated and directed toward the substrate 24. In a non-limiting example, the ribbon beam 32 containing free radicals may be extracted through the radially elongated nozzle 20. The nozzle 20 may have an elongated profile and may define an aperture 40 having a width measured in a direction parallel to the X-axis (and parallel to a longitudinal axis of the plasma chamber 18) of the illustrated Cartesian coordinate system shown in FIG. 2B, and having a height measured in a direction parallel to the Y-axis of the illustrated Cartesian coordinate system. In various embodiments, an aspect ratio of the width of the aperture 40 relative to the height of the aperture 40 may be in a range of 12:1 to 60:1. In specific examples, the aperture 40 may have a width of 300 millimeters and a height in a range of 5 millimeters to 25 millimeters. The present disclosure is not limited in this regard. The aperture 40 may have a depth as measured in a direction parallel to the Z-axis of the illustrated Cartesian coordinate system. In various embodiments, the aperture 40 may have a depth in a range of 7 millimeters to 20 millimeters. In a particular embodiment, the aperture 40 may have a depth of 10 millimeters. The present disclosure is not limited in this regard. Thus, the radially-elongated nozzle 20 may funnel or channel free radicals exiting the plasma chamber 18 in the ribbon beam 32, and may tend to collimate the free radicals and facilitate a long mean free path of the free radicals, where the free radicals (and the ribbon beam 32 generally) may otherwise tend to diverge after exiting the plasma chamber 18. An intended directionality of the ribbon beam 32 may thus be preserved when used to selectively deposit a thin film on the substrate 24.

In various embodiments, the nozzle 20 may be provided with a plurality of vertically oriented cross members 42 disposed in a parallel, spaced apart relationship across the width of the aperture 40 to facilitate further funneling and channeling of the free radicals exiting the plasma chamber 18. In various embodiments, a barrier 46 defining a secondary aperture 48 may be disposed between the plasma chamber 18 and the substrate 24, with the secondary aperture 48 located in the path of the ribbon beam 32. The secondary aperture 48 may operate to direct and further collimate, or "re-collimate," the ribbon beam 32 at a location nearer the substrate 24 than the aperture 40 (also referred to hereinafter as "the primary aperture 40"), thus improving collimation of the ribbon beam 32.

At block 1400 of the exemplary method, the platen 22 may be rotated and/or moved for pivoting and/or scanning the substrate 24 relative to the plasma chamber 18 as indicated by arrows 50 and 52 in FIG. 1. Additionally, or alternatively, the plasma chamber 18 may be rotated about its long axis as indicated by the arrow 54. Thus, the collimated, free radical-containing ribbon beam 32 may be projected onto the substrate 24 at various oblique angles in a highly directional, anisotropic manner to deposit films on specific sides and/or portions of surface features (e.g., trenches, fins, etc.) of the substrate 24 while keeping other sides and/or portions of such surface features free of such depositions.

At block 1500 of the exemplary method, the system 10 may be operated in an "ion beam" mode by activating the bias supply 70 to extract ions from the plasma chamber 18 to provide an ion rich ribbon beam 32. At block 1600 of the method, the system 10 may be operated in a "radical mode" by deactivating (or not activating) the bias supply 70 to produce a ribbon beam rich in free radicals and not as rich in ions.

Those of ordinary skill in the art will appreciate numerous advantages provided by the system 10 and corresponding method described above. A first advantage is the ability to facilitate directionally-specific, anisotropic deposition on a target substrate (e.g., depositing at specific, oblique angles relative to a surface of a substrate for depositing films on specific sides and/or portions of surface features while keeping other sides and/or portions of such surface features free of such depositions). A second advantage provided by the system 10 and corresponding method of the present disclosure is the ability to be selectively perform directionally-specific, anisotropic deposition on a target substrate in either an "ion beam" mode by activating the bias supply 70 to extract ions from the plasma chamber 18 to provide an ion rich ribbon beam 32, or a "radical mode" by deactivating (or not activating) the bias supply 70 to produce a ribbon beam rich in free radicals and not as rich in ions The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, while the present disclosure has been described herein in the context of a particular implementation in a particular environment for a particular purpose, those of ordinary skill in the art will recognize its usefulness is not limited thereto. Embodiments of the present disclosure may be beneficially implemented in any number of environments for any number of purposes. Accordingly, the claims set forth below shall be construed in view of the full breadth and spirit of the present disclosure as described herein.

The invention claimed is:

1. A ribbon beam plasma enhanced chemical vapor deposition (PECVD) system comprising:
   a process chamber containing a platen for supporting a substrate; and
   a plasma source disposed adjacent the process chamber and adapted to produce free radicals in a plasma chamber, the plasma chamber having an aperture associated therewith for allowing a beam of the free radicals to exit the plasma chamber, wherein the aperture is defined by a radially-elongated nozzle extending directly from the plasma chamber away from the plasma chamber and having a depth in a range of 7 millimeters to 20 millimeters for collimating the beam of free radicals exiting the plasma chamber, wherein at least a portion of the nozzle is located entirely outside of the plasma chamber, and wherein the nozzle is separate from, is attached to, and extends at least partially into, a sidewall of the plasma chamber;
   wherein the process chamber is maintained at a first pressure and the plasma chamber is maintained at a second pressure greater than the first pressure for driving the free radicals from the plasma chamber into the process chamber and onto the substrate;
   wherein an entirety of the plasma chamber, including the nozzle, is rotatable for directing the beam toward the platen at an oblique angle relative to a surface of the platen.

2. The ribbon beam PECVD system of claim 1, wherein the process chamber is at least one of rotatable and movable for directing the beam toward the platen at an oblique angle relative to a surface of the platen.

3. The ribbon beam PECVD system of claim 1, wherein the nozzle includes a plurality of cross members disposed in a parallel, spaced apart relationship across a width of the aperture.

4. The ribbon beam PECVD system of claim 1, wherein the first pressure in the process chamber is in a range of 10-6 torr to 10-2 torr, and the second pressure in the plasma chamber is in a range of 1 millitorr to 1 torr.

5. The ribbon beam PECVD system of claim 1, wherein the plasma source is configured to generate a plasma from a gaseous species supplied to the plasma chamber by a gas source.

6. The ribbon beam PECVD system of claim 5, wherein the gaseous species includes at least one of SiH4, CH4, NH3, O2, N2, SiCl4, GeH4, Ar, and WF6.

7. The ribbon beam PECVD system of claim 1, wherein the aperture is a primary aperture, the system further comprising a barrier disposed between the plasma chamber and the substrate and defining a secondary aperture located in a path of a ribbon beam emitted from the primary aperture.

8. The ribbon beam PECVD system of claim 1, further comprising a bias supply coupled to the plasma chamber and the process chamber and adapted to selectively apply a voltage difference between the plasma chamber and the substrate for extracting ions from the plasma chamber.

9. The ribbon beam PECVD system of claim 8, wherein the ribbon beam PECVD system is selectively operable in a first, ion beam mode, wherein the bias supply is activated to extract ions from the plasma chamber and produce a ribbon beam rich in ions, and a second, radical mode, wherein the bias supply not activated, thus producing a ribbon beam rich in free radicals and not as rich in ions.

10. A ribbon beam plasma enhanced chemical vapor deposition (PECVD) system comprising:
    a process chamber containing a platen for supporting a substrate; and
    a plasma source disposed adjacent the process chamber and adapted to produce free radicals from a gaseous species supplied to a plasma chamber, the plasma chamber having an aperture associated therewith for allowing a beam of the free radicals to exit the plasma chamber, wherein the aperture is defined by a radially-elongated nozzle extending directly from the plasma chamber away from the plasma chamber and having a depth in a range of 7 millimeters to 20 millimeters for collimating the beam of free radicals exiting the plasma chamber, wherein at least a portion of the nozzle is located entirely outside of the plasma chamber, and wherein the nozzle is separate from, is attached to, and extends at least partially into, a sidewall of the plasma chamber;
    wherein the process chamber is maintained at a first pressure in a range of 10-6 torr to 10-2 torr, and the plasma chamber is maintained as a second pressure in a range of 1 millitorr to 1 torr for driving the free radicals from the plasma chamber into the process chamber and onto the substrate; and wherein at least one of the platen and the plasma chamber is at least one of movable and rotatable for directing the beam toward the platen at an oblique angle relative to a surface of the platen;

wherein an entirety of the plasma chamber, including the nozzle, is rotatable for directing the beam toward the platen at an oblique angle relative to a surface of the platen.

11. A method of operating a ribbon beam plasma enhanced chemical vapor deposition (PECVD) system including a process chamber containing a platen for supporting a substrate, and a plasma source disposed adjacent the process chamber, the method comprising:

supplying a gaseous species to a plasma chamber of the plasma source from a gas source;

igniting the gaseous species to produce an energetic plasma in the plasma chamber;

establishing a pressure differential between the plasma chamber and the process chamber to extract a collimated ribbon beam containing free radicals of the plasma through an aperture associated with the plasma chamber for driving the free radicals from the plasma chamber into the process chamber and onto the substrate, and wherein the aperture is defined by a radially-elongated nozzle extending directly from the plasma chamber away from the plasma chamber and having a depth in a range of 7 millimeters to 20 millimeters, wherein at least a portion of the nozzle is located entirely outside of the plasma chamber, and wherein the nozzle is separate from, is attached to, and extends at least partially into, a sidewall of the plasma chamber; and rotating an entirety of the plasma chamber, including the nozzle, for directing the beam toward the substrate at an oblique angle relative to a surface of the substrate.

12. The method of claim 11, wherein the gaseous species includes at least one of $SiH_4$, $CH_4$, $NH_3$, $O_2$, $N_2$, $SiCl_4$, $GeH_4$, Ar, and $WF_6$.

13. The method of claim 11, wherein a first pressure in the process chamber is in a range of $10^{-6}$ torr to $10^{-2}$ torr, and a second pressure in the plasma chamber is in a range of 1 millitorr to 1 torr.

14. The method of claim 11, wherein the nozzle includes a plurality of cross members disposed in a parallel, spaced apart relationship across a width of the aperture.

15. The method of claim 11, wherein the aperture is a primary aperture, the method further comprising directing the ribbon beam through a secondary aperture in a barrier disposed between the plasma chamber and the substrate.

16. The method of claim 11, further comprising operating the PECVD system in an ion beam mode by activating a bias supply coupled to the plasma chamber and the process chamber to selectively apply a voltage difference between the plasma chamber and the substrate for extracting ions from the plasma chamber to produce a ribbon beam rich in ions.

17. The method of claim 16, further comprising operating the PECVD system in a radical mode by not activating the bias supply to produce a ribbon beam rich in free radicals and not as rich in ions.

* * * * *